United States Patent
Bensahel

(10) Patent No.: US 7,033,438 B2
(45) Date of Patent: Apr. 25, 2006

(54) GROWTH OF A SINGLE-CRYSTAL REGION OF A III-V COMPOUND ON A SINGLE-CRYSTAL SILICON SUBSTRATE

(75) Inventor: Daniel Bensahel, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 123 days.

(21) Appl. No.: 10/614,675

(22) Filed: Jul. 7, 2003

(65) Prior Publication Data

US 2004/0016395 A1    Jan. 29, 2004

(30) Foreign Application Priority Data

Jul. 12, 2002 (FR) .................. 02 08862

(51) Int. Cl.
*C30B 25/12*    (2006.01)

(52) U.S. Cl. ............... 117/101; 117/84; 117/89

(58) Field of Classification Search .......... 117/84, 117/89, 101
See application file for complete search history.

(56) References Cited

U.S. PATENT DOCUMENTS

| | | | |
|---|---|---|---|
| 4,551,394 A | 11/1985 | Betsch et al. | |
| 5,442,205 A | 8/1995 | Brasen et al. | |
| 6,039,803 A | 3/2000 | Fitzgerald et al. | |
| 6,171,936 B1 | 1/2001 | Fitzgerald | |
| 2001/0006249 A1 | 7/2001 | Fitzgerald | |

FOREIGN PATENT DOCUMENTS

DE    36 17 927 A1    12/1986

OTHER PUBLICATIONS

French Search Report from French Patent Application 02/08862, filed Jul. 12, 2002, abstract only.
Patent Abstracts of Japan vol. 009, No. 023 (E-293), Jan. 30, 1985 & JP 59 171115 A (Oki Denki Kogyo KK) Sep. 27, 1984, abstract only.

*Primary Examiner*—Felisa Hiteshew
(74) *Attorney, Agent, or Firm*—Lisa K. Jorgenson; James H. Morris; Wolf, Greefield & Sacks, P.C.

(57) ABSTRACT

A method for growing a single-crystal region of a III-V compound on a surface corresponding to a crystallographic plane of a single-crystal silicon substrate, including the steps of growing by epitaxy on the substrate a single-crystal germanium layer; etching in a portion of the thickness of the germanium layer an opening, the bottom of which corresponds to a single surface inclined with respect to the cristallographic plane or to several surfaces inclined with respect to the cristallographic plane; and growing the single-crystal III-V compound on the bottom of the opening.

16 Claims, 1 Drawing Sheet

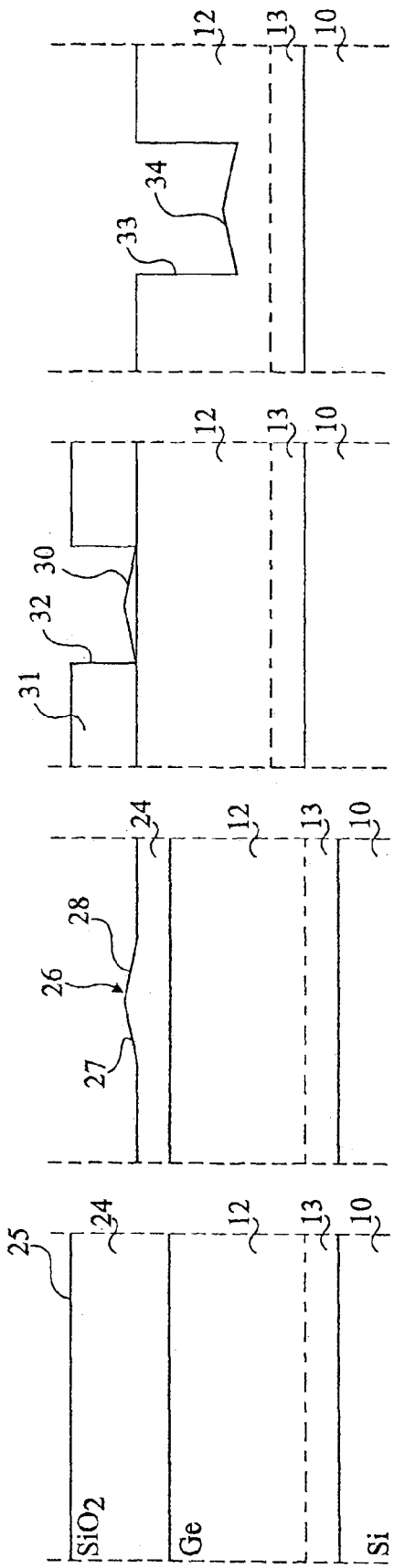
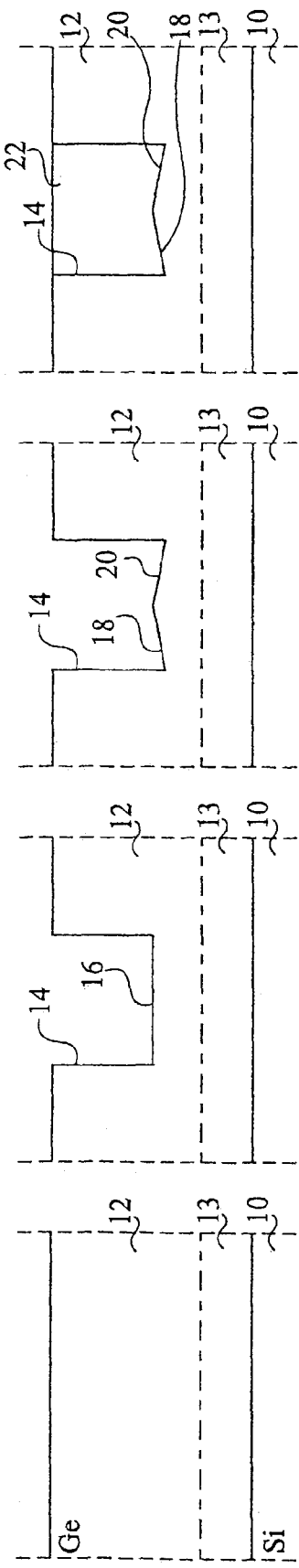

GROWTH OF A SINGLE-CRYSTAL REGION OF A III-V COMPOUND ON A SINGLE-CRYSTAL SILICON SUBSTRATE

BACKGROUND OF THE INVENTION

1. Field of the Invention

The present invention relates to a method of growth of a single-crystal region of a III-V compound on a single-crystal silicon substrate. The present invention also relates to the device obtained by the present method. The present invention especially applies to the forming of a single-crystal region of a binary compound of gallium arsenide (AsGa) on a single-crystal silicon substrate on which are formed other semiconductor components.

2. Discussion of the Related Art

III-V compounds are currently used to form optoelectronic devices, for example, solar cells, lasers or diodes, or to form fast circuits.

It is known to grow, by epitaxy, a layer of a binary AsGa compound on a solid germanium substrate, germanium and AsGa having a similar mesh parameter. However, when AsGa is grown on an oriented single-crystal germanium substrate, the orientation of which is for example (100), the obtained AsGa layer exhibits a polycrystalline structure. Indeed, AsGa is a binary compound which may start its growth on an As plane or on a Ga plane. On the (100) oriented germanium surface, the AsGa nucleation may start from any point of the surface according to an As plane or to a Ga plane. AsGa grains, which have started, some from a Ga surface, the others from an As surface, tend to grow and form, when they join, grain joints. Such grain joints are called antiphase domains (APD) and correspond to defective regions which are undesirable when optoelectronic devices or fast circuits are desired to be formed in the AsGa layer.

To avoid forming of grain joints, the surface of the solid single-crystal germanium is generally altered to form steps on the edges of which, with adapted deposition conditions, it is possible to have the AsGa nucleation start preferentially from the same initial As or Ga plane. Optimally, the solid germanium surface is mechanically worked, for example, by polishing, to obtain a surface inclined by approximately 6° with respect to the (100) growth planes.

There currently is a need for III-V compound single-crystal regions, in particular of AsGa, on a silicon wafer to integrate optoelectronic devices or fast circuits formed at the level of the AsGa regions with the other semiconductor components formed on the wafer.

For this purpose, portions of a single-crystal AsGa layer previously formed on solid germanium are currently placed on the silicon wafer.

Indeed, even if it is known to directly grow a single-crystal germanium layer of a few micrometers on a single-crystal silicon wafer, the obtained single-crystal germanium keeps the crystalline information provided by the single-crystal silicon and is thus oriented, most often according to orientation (100) which corresponds to the usual orientation of silicon wafers used in microelectronics. For the same reasons as those discussed previously, if a III-V compound is grown by epitaxy on the germanium surface formed on the silicon wafer, the obtained structure is polycrystalline. Now, no simple means are currently known to mechanically work a germanium layer of a few micrometers and form surfaces inclined by 6° on which a single crystal of the III-V compound could grow.

Further, when germanium is grown on a "de-oriented" single-crystal silicon wafer, that is, the surface of which would have been polished according to a plane inclined with respect to the silicon growth planes, it can be observed that the germanium tends to return to a conventional orientation, and not to keep the de-oriented character of silicon.

SUMMARY OF THE INVENTION

The present invention aims at growing single-crystal regions of III-V compounds directly on a single-crystal silicon wafer.

Another object of the present invention is to obtain a growth method of single crystal regions of III-V compounds on a single-crystal silicon wafer which is compatible with conventional integrated circuit manufacturing processes.

To achieve these and other objects, the present invention provides a method for growing a single-crystal region of a III-V compound on a surface corresponding to a crystallographic plane of a single-crystal silicon substrate, comprising the steps of growing by epitaxy on the substrate a single-crystal germanium layer; etching in a portion of the thickness of the germanium layer an opening, the bottom of which corresponds to a single surface inclined with respect to said surface or to several surfaces inclined with respect to said surface; and growing the single-crystal III-V compound on the bottom of the opening.

According to an embodiment of the present invention, the single-crystal silicon substrate has orientation (100) and said inclined surface(s) is (are) inclined by an angle of substantially from 5 to 7 degrees with respect to said surface.

According to an embodiment of the present invention, the single-crystal silicon substrate has orientation (100) and the bottom of the opening comprises two surfaces inclined by substantially from 5 to 7 degrees with respect to said surface.

According to an embodiment of the present invention, the method further comprises the step of growing on the single-crystal silicon substrate at least one layer of a silicon and germanium alloy on which the germanium layer is grown.

According to an embodiment of the present invention, the method further comprises the step of growing an oxide layer on the germanium layer and of etching said oxide layer to form a raised area on said oxide layer, the shape of the surface of said raised area being transferred by etching into the germanium layer.

According to an embodiment of the present invention, the thickness of the germanium layer separating the bottom of the opening and the single-crystal silicon substrate is greater than 300 nanometers.

According to an embodiment of the present invention, the opening has a cross-section with an area of a few tens of square micrometers.

According to an embodiment of the present invention, the III-V compound is gallium arsenide.

The present invention also provides a device comprising a single-crystal silicon substrate comprising a surface corresponding to a crystallographic plane covered with a single-crystal germanium layer, in which the germanium layer comprises at least one opening with a depth smaller than the thickness of the germanium layer, the bottom of the opening corresponding to a single surface inclined with respect to said surface or to several surfaces inclined with respect to said surface, said opening containing a III-V compound.

According to an embodiment of the present invention, an electronic component is formed in the III-V compound.

The foregoing objects, features and advantages of the present invention, will be discussed in detail in the following non-limiting description of specific embodiments in connection with the accompanying drawings.

BRIEF DESCRIPTION OF THE DRAWINGS

FIGS. 1A to 1D show cross-sections of the structure which is desired to be obtained at successive steps of a first embodiment according to the present invention; and FIGS. 2A to 2D show cross-sections of the structure which is desired to be obtained at successive steps of a second embodiment according to the present invention.

DETAILED DESCRIPTION

The present description will be made in the case where the III-V compound is gallium arsenide.

FIG. 1A shows a cross-section of a portion of a single-crystal silicon wafer 10 on which has been grown by epitaxy a single-crystal germanium layer 12 of a thickness that can be greater than one micrometer. The single-crystal silicon is oriented, for example, according to orientation (100) which is the orientation usually used in semiconductor manufacturing processes. Single-crystal germanium 12 reproduces the crystalline information of single-crystal silicon wafer 10 and exhibits an orientation direction similar to that of silicon.

According to an alternative of the present invention, single-crystal silicon wafer 10 may comprise the upper layer of a substrate-on-insulator type structure (SOI). Germanium layer 12 may further be formed by any known method and, in particular, may comprise a succession of layers of a silicon and germanium alloy, SiGe, where the atomic concentration in germanium increases from zero to 100% as it is moved away from silicon wafer 10.

For such a single-crystal germanium layer 12, it is known that beyond a sufficient thickness, the surface density of defects, especially of emergent dislocations, is small, typically under 106 cm-2. Reference numeral 13 represents the portion of germanium layer 12 close to silicon wafer 10 for which the surface density of defects is greater than acceptable values. Portion 13 of germanium layer 12 typically has a thickness on the order of 300 nanometers.

In FIG. 1B, an opening 14 has been etched in germanium layer 12, the dimensions of which are slightly greater than the dimensions of the active AsGa area which is desired to be formed. As an example, the cross-section of opening 14 may be a square or a rectangle, having sides measuring less than 10 micrometers. Opening 14 may belong to a set of openings simultaneously formed in germanium layer 12, and each of which is associated with an AsGa region which is desired to be formed. The etch used may be a dry etch performed after deposition of a resist on germanium layer 12, insolation of the resist to define the distribution of openings 14 at the locations where active areas of the III-V compound are desired to be formed, followed by the resist development.

Bottom 16 of opening 14 obtained with such an etch is typically substantially flat and corresponds to a (100) germanium growth plane. The depth of opening 14 is smaller than the total thickness of germanium layer 12 decreased by the thickness of portion 13 to ensure the absence of emerging dislocations on bottom 16.

FIG. 1C shows the structure obtained once bottom 16 of opening 14 has been altered. This may be obtained by modifying the parameters of a reactive ionic etch to favor redepositions at the bottom of opening 14. Two roof-shaped inclined surfaces 18, 20 are obtained, each surface 18, 20 being generally inclined by an angle of approximately 6° with respect to an orientation plane (100) of the germanium. Each surface 18, 20 is formed in practice of a succession of "steps" at the scale of atomic silicon planes.

According to an alternative, a single surface inclined by 6° with respect to a (100) orientation plane of the germanium, or a recess with two surfaces inclined by 6° with respect to a (100) orientation plane of the germanium may be formed.

In FIG. 1D, AsGa has been grown on inclined surfaces 18, 20 to form a single-crystal AsGa region 22. The thickness of region 22 may be sufficiently high, for example, greater than 1 micrometer, for the altered shape of bottom 16 of opening 14 to be substantially smoothed at the surface of region 22. Preferably, the AsGa is made to grow above the surface of germanium layer 12 and the growth is followed by a leveling, for example, by chem-mech polishing. An optoelectronic device or a fast circuit can then be defined in region 22 according to the desired application.

FIGS. 2A to 2D illustrate the steps of a second embodiment of the present invention.

According to the second embodiment, as shown in FIG. 2A, single-crystal germanium layer 12 formed on single-crystal silicon wafer 10 is covered with a silicon oxide 24 of a thickness for example on the order of 200 nm, surface 25 of which is substantially planar.

In FIG. 2B, silicon oxide layer 24 has been etched to form a non-planar area 26 at the level of the location where an active AsGa area is desired to be formed. Non-planar area 26 may, for example, have the shape of a roof with two inclined sides 27, 28, each side being inclined by approximately 6 degrees with respect to the planar surface of oxide layer 24. The roof shape may be obtained by covering silicon oxide layer 24 with a mask, by forming in the mask an opening at the level of the area to be etched, a mask island being left at the center of the opening, and by isotropically etching silicon oxide layer 24 through the opening. The presence of the island results in the forming of the inclined sides.

In FIG. 2C, silicon oxide layer 24 has been etched down to germanium layer 12 to only leave a raised area 30 formed of silicon oxide at the surface of germanium layer 12. Raised area 30 reproduces the shape of non-planar area 26 formed at the previous step. A mask 31 has been deposited on germanium layer 12 and raised area 30. An opening 32, formed in mask 31, exposes raised area 30, mask 31 being capable of slightly covering the periphery of raised area 30.

In FIG. 2D, raised area 30 and single-crystal germanium 12 have been etched through opening 32 of mask 31 by an anisotropic etch method using a product etching substantially at the same speed the silicon oxide and the germanium to form an opening 33 in germanium layer 12, bottom 34 of which reproduces the shape of relief 30. The step of forming of the single-crystal AsGa region in opening 32 is identical to what has been described previously.

Other III-V compounds, the direct growth of which is delicate on germanium, for example, InAsGa, may be grown in a known manner on the AsGa layer.

The present invention has been described in the context of the forming of AsGa. Of course, the present method may be implemented for the growth of any III-V compound having a mesh parameter compatible with that of germanium.

The present invention has many advantages.

First, it enables forming of active areas of a single-crystal III-V compound on a silicon wafer.

Second, it enables forming of active areas of a single-crystal III-V compound having a surface area on the order of a few tens of square micrometers, which currently corresponds to the dimensions required to form optoelectronic devices or fast circuits.

Third, the previously-described embodiments implement techniques currently used upon forming of conventional integrated circuits on a silicon wafer and can thus be easily integrated in conventional manufacturing processes.

Of course, the present invention is likely to have various alterations, modifications, and improvement which will readily occur to those skilled in the art. In particular, in the second embodiment, the silicon oxide layer may be replaced with nitride Si3N4 or SI—O—N type compounds.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for growing a single-crystal region of a III-V compound on a surface corresponding to a crystallographic plane of a single-crystal silicon substrate, comprising the steps of:
   growing by epitaxy on the substrate a single-crystal germanium layer;
   etching in a portion of the thickness of the germanium layer an opening, a bottom of which corresponds to a single surface inclined with respect to said crystallographic plane or to several surfaces inclined with respect to said crystallographic plane; and
   growing the single-crystal III-V compound on the bottom of the opening.

2. The method of claim 1, wherein the single-crystal silicon substrate has an orientation and said inclined surface(s) is (are) inclined by an angle of substantially from 5 to 7 degrees with respect to said crystallographic plane.

3. The method of claim 1, wherein the single-crystal silicon substrate has an orientation and the bottom of the opening comprises two surfaces inclined by substantially from 5 to 7 degrees with respect to said crystallographic plane.

4. The method of claim 1, further comprising the step of growing on the single-crystal silicon substrate at least one layer of a silicon and germanium alloy on which the germanium layer is grown.

5. The method of claim 1, further comprising the step of growing an oxide layer on the germanium layer and of etching said oxide layer to form a relief area on said oxide layer, a shape of the surface of said relief area being transferred by etching into the germanium layer.

6. The method of claim 1, wherein the thickness of the germanium layer separating the bottom of the opening and the single-crystal silicon substrate is greater than 300 nanometers.

7. The method of claim 1, wherein the opening has a cross-section surface area of a few tens of square micrometers.

8. The method of claim 1, wherein the III-V compound is gallium arsenide.

9. A method for growing a single-crystal region of a III-V compound on a surface corresponding to a crystallographic plane of a single-crystal silicon substrate, comprising:
   growing by epitaxy, on the substrate, a single-crystal germanium layer;
   etching in the germanium layer an opening, a bottom of the opening corresponding to a single surface inclined with respect to the crystallographic plane or to several surfaces inclined with respect to the crystallographic plane; and
   growing the single-crystal III-V compound on the bottom of the opening.

10. The method of claim 9, wherein the single-crystal silicon substrate has an orientation and said inclined surface(s) is (are) inclined by an angle of substantially from 5 to 7 degrees with respect to said crystallographic plane.

11. The method of claim 9, wherein the single-crystal silicon substrate has an orientation and the bottom of the opening comprises two surfaces inclined by substantially from 5 to 7 degrees with respect to said crystallographic plane.

12. The method of claim 9, further comprising growing, on the single-crystal silicon substrate, at least one layer of a silicon and germanium alloy on which the germanium layer is grown.

13. The method of claim 9, further comprising growing an oxide layer on the germanium layer and etching the oxide layer to form a relief area on the oxide layer, a shape of the surface of the relief area being transferred by etching into the germanium layer.

14. The method of claim 9, wherein a thickness of the germanium layer separating the bottom of the opening and the single-crystal silicon substrate is greater than 300 nanometers.

15. The method of claim 9, wherein the opening has a cross-section surface area of a few tens of square micrometers.

16. The method of claim 9, wherein the III-V compound is gallium arsenide.

* * * * *